United States Patent
Oguchi et al.

(10) Patent No.: US 6,690,598 B2
(45) Date of Patent: Feb. 10, 2004

(54) FERROELECTRIC MEMORY DEVICE AND METHOD OF MANUFACTURING THE SAME

(75) Inventors: Koichi Oguchi, Suwa (JP); Eiji Natori, Chino (JP); Kazumasa Hasegawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 204 days.

(21) Appl. No.: 09/895,205

(22) Filed: Jul. 2, 2001

(65) Prior Publication Data

US 2002/0018357 A1 Feb. 14, 2002

(30) Foreign Application Priority Data

Jul. 7, 2000 (JP) ........................................ 2000-206588

(51) Int. Cl.⁷ .............................................. G11C 11/22
(52) U.S. Cl. ........................... 365/145; 365/51; 365/63; 257/315; 257/316
(58) Field of Search ........................... 365/145, 51, 63; 257/315, 314, 316, 317

(56) References Cited

U.S. PATENT DOCUMENTS

| | | | |
|---|---|---|---|
| 5,414,654 A | * 5/1995 | Kubota et al. | 365/145 |
| 5,545,291 A | 8/1996 | Smith et al. | |
| 5,783,856 A | 7/1998 | Smith et al. | |
| 5,824,186 A | 10/1998 | Smith et al. | |
| 5,904,545 A | 5/1999 | Smith et al. | |
| 6,054,734 A | * 4/2000 | Aozasa et al. | 257/315 |
| 6,111,777 A | * 8/2000 | Ogiwara et al. | 365/145 |
| 6,218,197 B1 | * 4/2001 | Kasai | 438/3 |

FOREIGN PATENT DOCUMENTS

| | | |
|---|---|---|
| JP | A 8-255879 | 10/1996 |
| JP | A 9-116107 | 5/1997 |

OTHER PUBLICATIONS

U.S. patent application Ser. No. 09/892,872, Shimoda et al., filed Jun. 28, 2001.
Drobac, "Fluidic Self–Assembly Could Change the Way FPDs Are Made", *Information Display*, Nov. 1999, pp 12–16.

* cited by examiner

Primary Examiner—Son T. Dinh
(74) Attorney, Agent, or Firm—Oliff & Berridge, PLC

(57) ABSTRACT

A ferroelectric memory device includes a memory cell array and a peripheral circuit section. The memory cell array, in which memory cells are arranged in a matrix, includes first signal electrodes, second signal electrodes which are arranged in a direction so as to intersect the first signal electrodes, and a ferroelectric layer disposed at least at intersection regions between the first signal electrodes and the second signal electrodes. The peripheral circuit section includes circuits for selectively allowing information to be written into or read from the memory cells, such as a first driver circuit, a second driver circuit, and a signal detection circuit. The memory cell array and the peripheral circuit section are disposed in different layers so as to be layered. This ferroelectric memory device can significantly increase the degree of integration of the memory cells and decrease the chip area.

13 Claims, 7 Drawing Sheets

FERROELECTRIC MEMORY DEVICE AND METHOD OF MANUFACTURING THE SAME

Japanese Patent Application No. 2000-206588, filed Jul. 7, 2000, is hereby incorporated by reference in its entirety.

TECHNICAL FIELD

The present invention relates to a ferroelectric memory device. More particularly, the present invention relates to a simple matrix ferroelectric memory device using only ferroelectric capacitors in which no cell transistor is used, and a method of manufacturing the same.

BACKGROUND

In semiconductor memories, a memory cell array and peripheral circuits for selectively allowing information to be written into or read from memory cells are generally formed on a single substrate. Therefore, the memory cell array and the peripheral circuits are arranged in the same plane. This results in an increase in the chip area, whereby the degree of integration of the memory cells is limited.

SUMMARY

An objective of the present invention is to provide a ferroelectric memory device capable of significantly increasing the degree of integration of memory cells and decreasing the chip area, and a method of manufacturing the same.

A ferroelectric memory device according to the present invention comprises:
 a memory cell array, in which memory cells are arranged in a matrix, including first signal electrodes, second signal electrodes arranged in a direction intersecting the first signal electrodes, and a ferroelectric layer disposed at least in intersection regions between the first signal electrodes and the second signal electrodes; and
 a peripheral circuit section for selectively performing information write or information read with respect to the memory cells,
 wherein the memory cell array and the peripheral circuit section are disposed in different layers.

According to this ferroelectric memory device, the layout area can be significantly decreased in comparison with the case of disposing the peripheral circuit section and the memory cell array on a single plane, by disposing the memory cell array and the peripheral circuit section in different layers in a layered manner, for example. Therefore, the size of the device can be decreased and the degree of integration of the memory cells can be significantly increased.

In this ferroelectric memory device, the first signal electrodes are electrodes for selecting either rows or columns. The second signal electrodes are electrodes for selecting columns when the first signal electrodes select rows. The second signal electrodes are electrodes for selecting rows when the first signal electrodes select columns.

As configurations in which the memory cell array and the peripheral circuit section are disposed in different layers, the following configurations can be given. Specific effects of these configurations are described later.

(1) The memory cell array and the peripheral circuit section may be layered on a single semiconductor substrate in order from the peripheral circuit section to the memory cell array. Specifically, the peripheral circuit section including an electronic device such as a MOS transistor may be formed on a semiconductor substrate, and the memory cell array may be formed on the peripheral circuit section.

(2) The memory cell array and the peripheral circuit section may be formed in different chips, to form a memory cell array chip and a peripheral circuit chip, respectively. The memory cell array chip and the peripheral circuit chip may be layered on a mounting base in the order from the peripheral circuit chip to the memory cell array chip or in the order from the memory cell array chip to the peripheral circuit chip.

In the case of this embodiment, the mounting base may have a depressed portion for a chip to be positioned, and the peripheral circuit chip and the memory cell array chip may be mounted in the depressed portion in a layered manner. Moreover, a semiconductor, glass, or plastic may be used as a material for the mounting base by forming the peripheral circuit section and the memory cell array in the chips, whereby selectivity of the material for the mounting base can be increased.

The memory cell array may have various configurations. Some of these configurations are illustrated below. Actions and effects of these configurations are described later.

(1) The memory cell array may comprise an underlying layer formed of a ferroelectric material or a material having a crystal structure similar to a structure of a ferroelectric, on a substrate, and the first signal electrodes, the ferroelectric layer, and the second signal electrodes may be layered on the underlying layer.

(2) The memory cell array may comprise an insulating substrate, the first signal electrodes provided in grooves formed in the insulating substrate, the ferroelectric layer, and the second signal electrodes, and the ferroelectric layer and the second signal electrodes may be layered on the insulating substrate on which the first signal electrodes are formed. The insulating substrate used herein refers to a substrate of which at least the surface area on which the first signal electrodes are formed has insulating properties. The insulating substrate may be a substrate formed of a conductive material of which only the surface area has insulating properties.

(3) The memory cell array may comprise an insulating substrate on which is formed depressed portions and projected portions in a given pattern, the first signal electrodes, may be formed at a bottom of the depressed portions and an upper side of the projected portions, and the ferroelectric layer and the second signal electrodes may be layered on the insulating substrate on which the first signal electrodes are formed.

(4) the memory cell array may comprise an insulating substrate on which is formed the first signal electrodes, the ferroelectric layers, and the second signal electrodes, the ferroelectric layer may be formed in a divided manner and disposed in the intersection regions between the first signal electrodes and the second signal electrodes, and dielectric layers differing from the ferroelectric layers may be formed between the adjacent divided ferroelectric layers. The dielectric layers may be formed of a material with a dielectric constant smaller than a dielectric constant of the ferroelectric layer.

In the ferroelectric memory device according to the present invention, a plurality of unit blocks of memory devices may be arranged in a given pattern. Examples of this aspect are described below.

(1) A ferroelectric memory device including an array of ferroelectric memory devices, comprising a plurality of unit blocks of the above-described ferroelectric memory devices arranged in a given pattern.

Such a ferroelectric memory device may comprise:

a plurality of depressed portions having a given shape disposed in a mounting base in a given pattern, and a memory cell array and a peripheral circuit section which are formed in different chips to form a memory cell array chip and a peripheral circuit chip, respectively, and the memory cell array chip and the peripheral circuit chip may have a given shape corresponding to a shape of each of the depressed portions in a layered manner, and the peripheral circuit chip and the memory cell array chip may be layered in each of the depressed portions. In this case, the order of layering the peripheral circuit section chip and the memory cell array chip is not limited. The memory cell array chip may be layered on the peripheral circuit chip, or the peripheral circuit chip may be layered on the memory cell array chip.

(2) A ferroelectric memory device comprising a plurality of unit blocks of at least memory cell arrays arranged in a given pattern. In this case, at least part of a peripheral circuit section may be disposed between the unit blocks.

The ferroelectric memory device according to the present invention may comprise a plurality of sets of a memory cell array and a peripheral circuit section layered on an insulating substrate. In this case, the memory cell array and the peripheral circuit section may be formed in different chips, to form a memory cell array chip and a peripheral circuit chip, respectively.

The ferroelectric memory device according to the present invention may be obtained by a method of manufacturing a ferroelectric memory device comprising the following steps (a) and (b).

(a) a step of forming a peripheral circuit section for selectively writing or reading information into or from memory cells on a semiconductor substrate; and (b) a step of forming at least first signal electrodes, second signal electrodes arranged in a direction intersecting the first signal electrodes, and a ferroelectric layer disposed at least in intersection regions between the first signal electrodes and the second signal electrodes on the peripheral circuit section, so as to form a memory cell array in which memory cells are arranged in a matrix.

The ferroelectric memory device according to the present invention may be obtained by a method of manufacturing a ferroelectric memory device in which a peripheral circuit chip and a memory cell array chip are mounted in a layered manner using FSA (Fluidic Self-Assembly), the method comprising the following steps (a) to (d).

(a) a step of forming one or more depressed portions having a given pattern in a mounting base, (b) a step of forming the peripheral circuit chip and the memory cell array chip having a given shape corresponding to a shape of each of the depressed portions, (c) a step of supplying liquid, in which the peripheral circuit chip or the memory cell array chip is included, on the surface of the mounting base, to position the peripheral circuit chip or the memory cell array chip in the one or more depressed portions, and (d) a step of supplying liquid, in which the memory cell array chip or the peripheral circuit chip is included, on the surface of the mounting base, to position the peripheral circuit chip or the memory cell array chip, which is a different kind of chip from a chip positioned in the depressed portion in the step (c), in the depressed portion.

DETAILED DESCRIPTION

First Embodiment

Device

Figure 1:
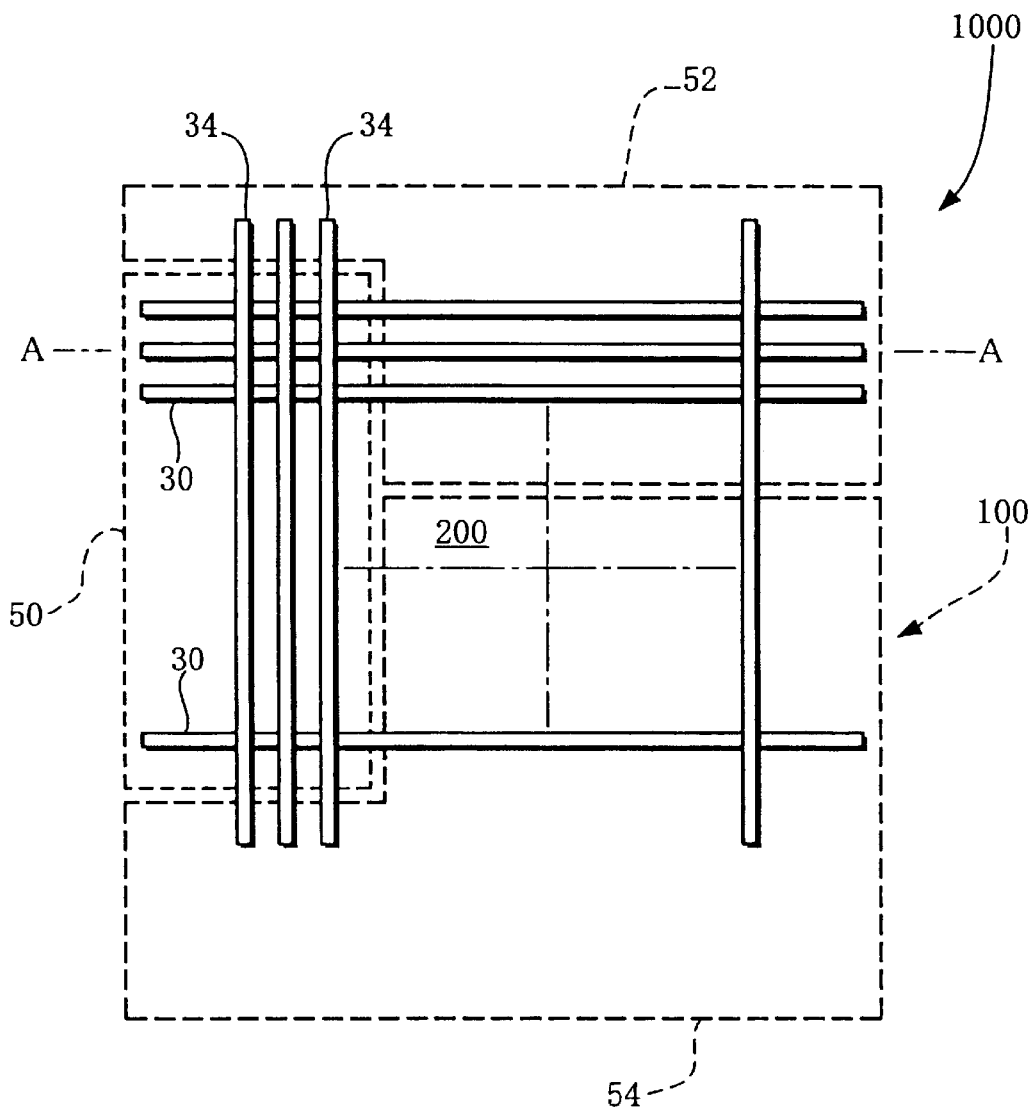
FIG. 1 is a plan view schematically showing a ferroelectric memory device according to a first embodiment of the present invention.
Figure 2:
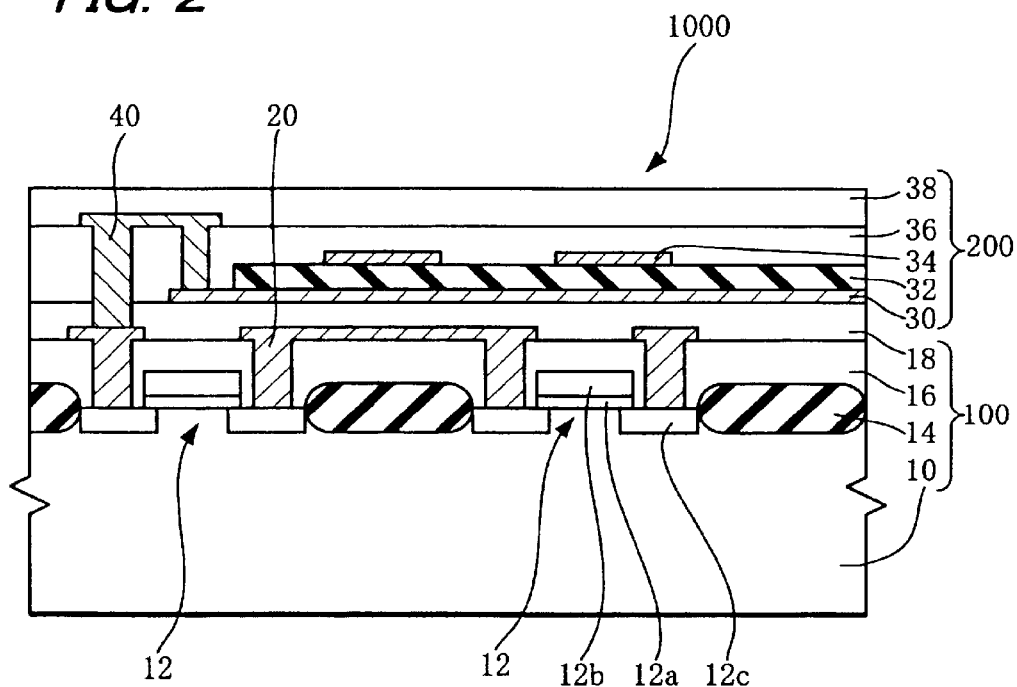
FIG. 2 is a cross-sectional view schematically showing a portion along the line A—A shown in FIG. 1.

FIG. 1 is a plan view schematically showing a ferroelectric memory device according to this embodiment. FIG. 2 is a cross-sectional view schematically showing part of the ferroelectric memory device along the line A—A shown in FIG. 1.

A ferroelectric memory device 1000 according to this embodiment includes a memory cell array 200 and a peripheral circuit section 100. The memory cell array 200 and the peripheral circuit section 100 are formed in different layers. In this example, the peripheral circuit section 100 is formed in a lower layer and the memory cell array 200 is formed in an upper layer.

In the memory cell array 200, first signal electrodes (word lines) 30 for selecting rows and second signal electrodes (bit lines) 34 for selecting columns are arranged so as to intersect at right angles. Note that the first signal electrodes may be the bit lines and the second signal electrodes may be the word lines. A ferroelectric layer 32 is disposed between the first signal electrodes 30 and the second signal electrodes 34, as shown in FIG. 2. Therefore, memory cells including ferroelectric capacitors are formed in each intersection region between the first signal electrodes 30 and the second signal electrodes 34. A first protective layer 36 is formed of an insulating layer so as to cover the first signal electrodes 30, the ferroelectric layer 32, and the second signal electrodes 34. A second insulating protective layer 38 is formed on the first protective layer 36 so as to cover a second interconnect layer 40. Each of the first signal electrodes 30 and the second signal electrodes 34 is electrically connected to a first interconnect layer 20 in the peripheral circuit section 100 through the second interconnect layer 40.

The peripheral circuit section 100 includes various types of circuits for allowing information to be selectively written into or read from the memory cells, as shown in FIG. 1. For example, the peripheral circuit section 100 includes a first driver circuit 50 for selectively controlling the first signal electrodes 30, a second driver circuit 52 for selectively controlling the second signal electrodes 34, and a signal detection circuit 54 such as a sense amplifier, as shown in FIG. 1.

The peripheral circuit section 100 includes MOS transistors formed on a semiconductor substrate 10, as shown in FIG. 2. The MOS transistors 12 include a gate insulating layer 12a, a gate electrode 12b, and source/drain regions 12c. Each of the MOS transistors 12 is isolated from the others by element isolation regions 14. A first interlayer dielectric 16 is formed on the semiconductor substrate 10 on which the MOS transistors 12 are formed. Each of the MOS transistors 12 is electrically connected through the first interconnect layer 20 formed in a given pattern. A second interlayer dielectric 18 is formed on the first interconnect layer 20. The peripheral circuit section 100 and the memory cell array 200 are electrically connected through the second interconnect layer 40.

An example of read or write operations in the ferroelectric memory device 1000 of this embodiment is described below.

In the read operation, a read voltage "$V_0$" is applied to the capacitor of the selected cell. This also serves as a write operation of data "0". At this time, current flowing through the selected bit line or a potential when allowing the bit line to be in a high impedance state is read by the sense amplifier. A given voltage is applied to the capacitors of non-selected cells in order to prevent the occurrence of crosstalk during the read operation.

In the write operation, a voltage "$-V_0$" is applied to the capacitor of the selected cell in the case of writing data "1". In the case of writing data "0", a voltage which does not cause polarization inversion of the selected cell to occur is applied to the capacitor of the selected cell, thereby holding the "0" state written during the read operation. At this time, a given voltage is applied to the capacitors of non-selected cells in order to prevent the occurrence of crosstalk during the write operation.

According to the ferroelectric memory device having the above structure, allowing the peripheral circuit section 100 and the memory cell array 200 to be layered on the single semiconductor substrate 10 ensures that the chip area can be significantly decreased in comparison with the case of disposing the peripheral circuit section and the memory cell array on the same plane, whereby the degree of integration of the memory cells can be increased.

Device Manufacture Method

Figure 3:
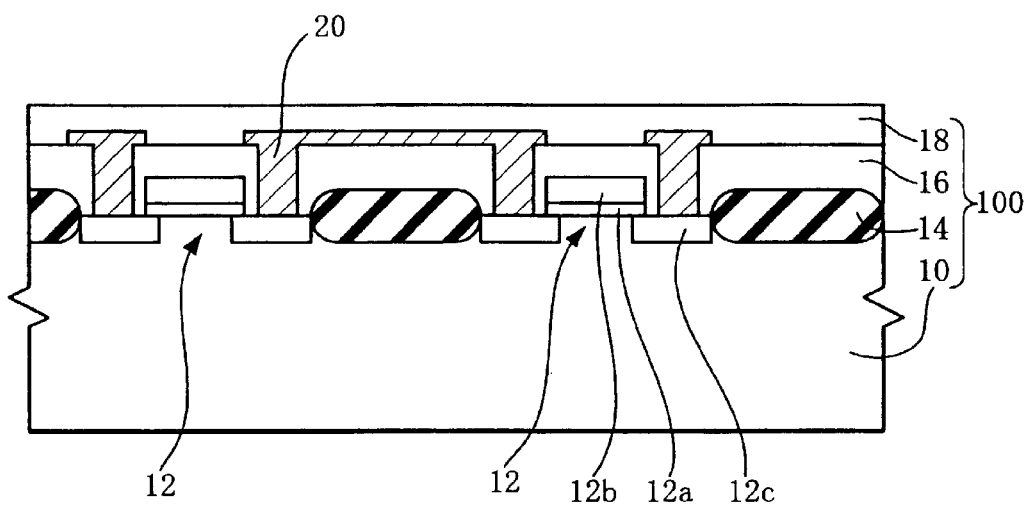
FIG. 3 is a cross-sectional view schematically showing a manufacture step of the ferroelectric memory device shown in FIGS. 1 and 2.
Figure 4:
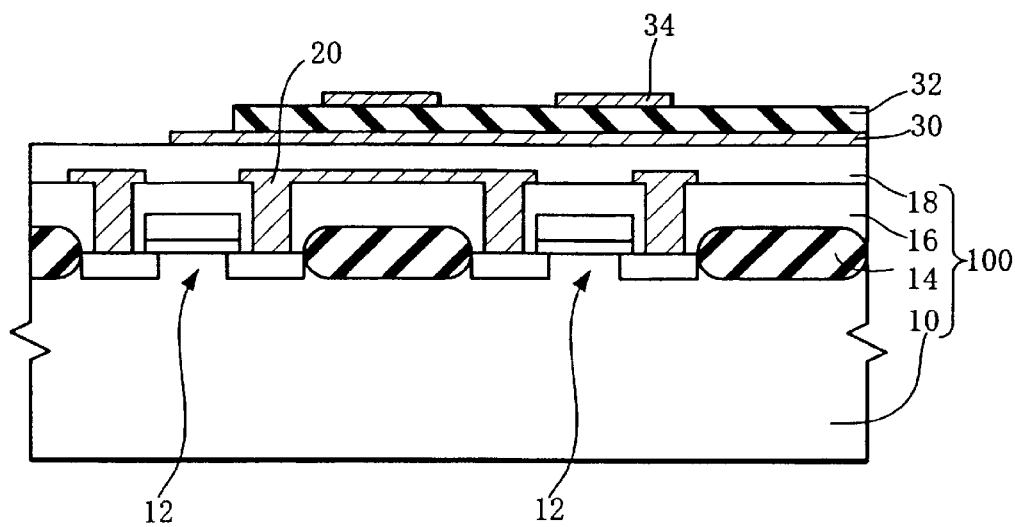
FIG. 4 is a cross-sectional view schematically showing a manufacture step of the ferroelectric memory device shown in FIGS. 1 and 2.

An example of a method of manufacturing the above ferroelectric memory device is described below. FIGS. 3 and 4 are cross-sectional views schematically showing the manufacture steps of the ferroelectric memory device 1000.

The peripheral circuit section 100 is formed using a conventional LSI process, as shown in FIG. 3. Specifically, the MOS transistors 12 are formed on the semiconductor substrate 10. For example, the element isolation regions 14 are formed in a specific region on the semiconductor substrate 10 using a trench isolation process, a LOCOS process, or the like. The gate insulating layer 12a and the gate electrode 12b are formed. The source/drain regions 12c are formed by doping the semiconductor substrate 10 with impurities. After forming the first interlayer dielectric 16, contact holes are formed. The first interconnect layer 20 is formed in a given pattern. The second interlayer dielectric 18 is formed on the first interlayer dielectric 16 on which the first interconnect layer 20 is formed. The peripheral circuit section 100, including various types of circuits such as the driver circuits 50 and 52 and the signal detection circuit 54, is formed in this manner.

The memory cell array 200 is formed on the peripheral circuit section 100, as shown in FIGS. 2 and 4. Specifically, the first signal electrodes 30 are formed on the second interlayer dielectric 18 in the peripheral circuit section 100, arranged in a given pattern. The ferroelectric layer 32 is formed on the second interlayer dielectric 18 on which the first signal electrodes 30 are formed. The second signal electrodes 34 are formed on the ferroelectric layer 32 so as to be arranged in a given pattern. The first protective layer 36 including an insulating layer is formed on the ferroelectric layer 32 on which the second signal electrodes 34 are formed, as shown in FIG. 2. After forming contact holes in a given region of the first protective layer 36, the second interconnect layer 40 is formed in a given pattern. The second interconnect layer 40 electrically connects the peripheral circuit section 100 with the memory cell array 200. The second protective layer 38 including an insulating layer is formed in the uppermost layer. The memory cell array 200 is formed in this manner.

The formation method for the memory cell array 200 is not limited. Any conventional method and material may be used. For example, the first signal electrodes 30 and the second signal electrodes 34 may be formed using a method such as sputtering or deposition, and patterned by etching using a method such as RIE, sputter etching, or plasma etching.

There are no specific limitations to the materials for the first signal electrodes 30 and the second signal electrodes 34. For example, Ir, $IrO_x$, Pt, $RuO_x$, $SrRuO_x$, and $LaSrCoO_x$ can be given. Each of the first signal electrodes 30 and the second signal electrodes 34 may have either a single layer structure or a multilayer structure including a plurality of layers.

As examples of the material for the ferroelectric layer, PZT ($PbZr_zTi_{1-z}O_3$) and SBT ($SrBi_2Ta_2O_9$) can be given. As the formation method for the ferroelectric layer, a spin coating process or a dipping process using a sol-gel material or an MOD material, a sputtering process, an MOCVD process, and a laser ablation process can be given.

Second Embodiment

Device

Figure 5:
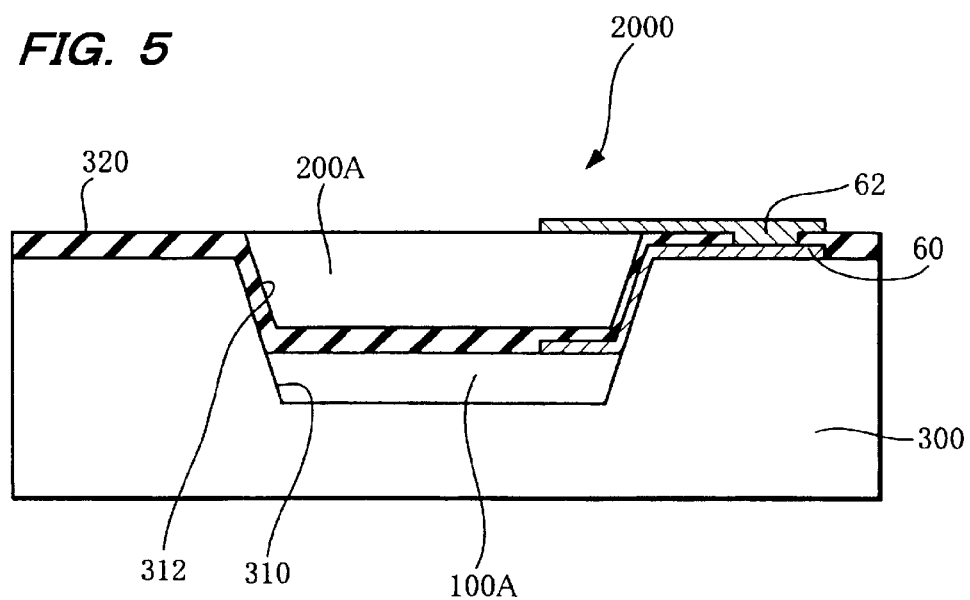
FIG. 5 is a cross-sectional view schematically showing a ferroelectric memory device according to a second embodiment of the present invention.

FIG. 5 is a cross-sectional view schematically showing a ferroelectric memory device according to this embodiment. A ferroelectric memory device 2000 according to this embodiment differs from the first embodiment in that the peripheral circuit section and the memory cell array make up different chips. Specifically, in the ferroelectric memory device 2000, a peripheral circuit chip 100A and a memory cell array chip 200A are positioned in a depressed portion 310 formed in a specific region of a mounting base 300 in a layered manner.

Figure 6:
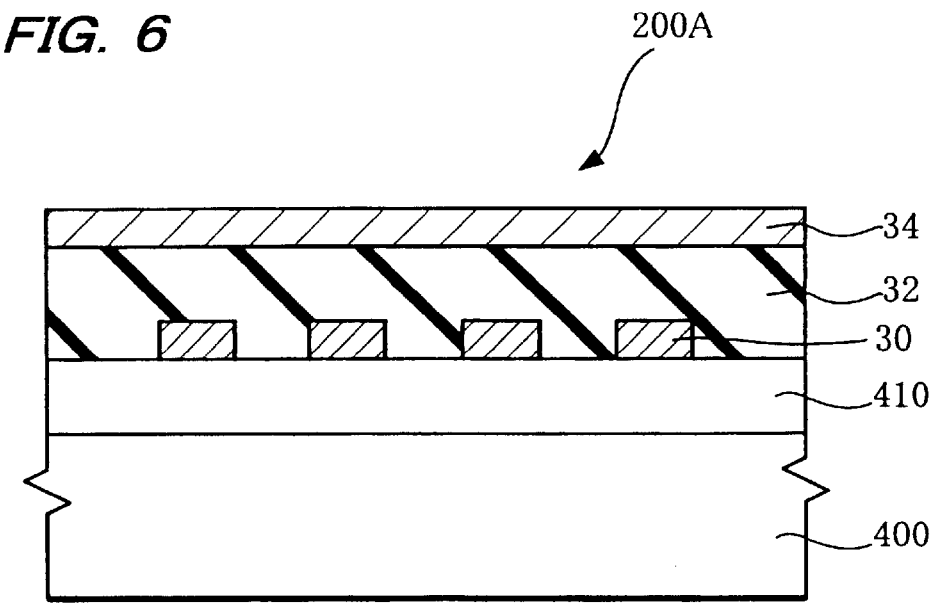
FIG. 6 is a cross-sectional view showing an essential portion of the ferroelectric memory device shown in FIG. 5.

In the memory cell array chip 200A, an underlying layer 410 including a ferroelectric layer and the like is formed on a substrate 400, as shown in FIG. 6. Formation of such an underlying layer 410 ensures that the crystal growth of the ferroelectric layer 32 which makes up the capacitor readily occurs, whereby the crystallinity of the ferroelectric layer 32 can be improved. Therefore, as the material for the underlying layer 410, it is desirable to choose a material having a crystal structure and composition similar to those of the ferroelectric layer 32. For example, in the case of using PZT as the material for the ferroelectric layer 32, PZT, $PbTiO_3$, $SrTiO_3$, $BaTiO_3$, and the like are desirable as the material for the underlying layer 410. In the case of using SBT as the material for the ferroelectric layer 32, SBT, $SrTiO_3$, $SrTaO_6$, $SrSnO_3$, and the like are desirable for the material for the underlying layer 410.

The first signal electrodes 30 are formed on the underlying layer 410 in a given pattern. The ferroelectric layer 32 is formed on the underlying layer 410 on which the first signal electrodes 30 are formed. The second signal electrodes 34 are formed on the ferroelectric layer 32 in a given pattern. Therefore, memory cells including the ferroelectric capacitors are formed in each intersection region between the first signal electrodes 30 and the second signal electrodes 34. A protective layer (not shown) is appropriately formed in the uppermost layer.

The underlying layer 410 is formed in the memory cell array chip 200A shown in FIG. 6. However, the underlying layer 410 is an optional layer and need not be formed depending on the type of the substrate 400.

The peripheral circuit chip 100A includes various types of circuits for selectively allowing information to be written into or read from the memory cells of the memory cell array chip 200A, in the same manner as in the first embodiment. For example, the peripheral circuit chip 100A includes a first driver circuit for selectively controlling the first signal electrodes 30, a second driver circuit for selectively controlling the second signal electrodes 34, and a signal detection circuit such as a sense amplifier.

The peripheral circuit chip 100A includes the MOS transistors 12 formed on the semiconductor substrate 10, as shown in FIG. 3, which is used in the description of the first embodiment. The MOS transistors 12 include the gate insulating layer 12a, the gate electrode 12b, and the source/drain regions 12c. Each of the MOS transistors 12 is isolated from the others by the element isolation regions 14. The first interlayer dielectric 16 is formed on the semiconductor substrate 10 on which the MOS transistors 12 are formed. Each of the MOS transistors 12 is electrically connected through the first interconnect layers 20 formed in a given pattern. The second interlayer dielectric (protective layer) 18 is formed on the first interconnect layer 20.

In the example shown in FIG. 5, a first connection interconnect layer 60 is formed along the wall surface of the depressed portion 310 formed in the mounting base 300 from the upper side of the peripheral circuit chip 10A. An insulating layer 320 is formed so as to cover the peripheral circuit chip 100 A and the first connection interconnect layer 60. A second connection interconnect layer 62 is formed for electrically connecting the first connection interconnect layer 60 with the memory cell array chip 200A through a contact section formed in a specific region of the insulating layer 320. Therefore, the peripheral circuit chip 100A and the memory cell array chip 200A are electrically connected through the first and second connection interconnect layers 60 and 62.

In this embodiment, a conventional method may be used as the method for mounting the peripheral circuit chip 100A and the memory cell array chip 200A in the depressed portion 310 formed in the mounting base 300. This conventional method is described below.

This method is called an FSA (Fluidic Self-Assembly: registered trademark) process. The FSA process is a technique including: dispersing electronic devices (hereinafter called "functional devices") having a given shape with a size ranging from 10 microns to several hundred microns in liquid; pouring this dispersion liquid over the surface of abase (corresponding to mounting base 300) including holes or positioning sections (corresponding to depressed portions 310) with a size and shape approximately the same as those of the functional devices; and allowing the functional devices to be positioned in the holes or positioning sections, thereby mounting the functional devices on the base. The FSA process is disclosed in S. Drobac. "INFORMATION DISPLAY", VOL. 11 (1999), pp. 12–16, U.S. Pat. No. 5,545,291, U.S. Pat. No. 5,783,856, U.S. Pat. No. 5,824,186, U.S. Pat. No. 5,904,545, and the like.

An example of the steps for mounting the semiconductor device using the FSA process is briefly described below.

(1) A single crystal silicon wafer including several hundreds to several millions of electronic devices is divided into several thousands to several millions of functional blocks by etching. The divided functional blocks have a given three-dimensional shape, with each having a specific function. The electronic devices may be either simple structure devices such as transistors or complex structure devices such as ICs.

(2) Abase in which these functional blocks are positioned is formed separately from the above functional blocks. Holes for positioning the functional blocks are formed in the base by incision, etching, or using a laser or the like. These holes are formed so as to coincide with the size and the shape of the functional blocks.

(3) The functional blocks formed by the above step are dispersed in liquid. This dispersion liquid is poured over the surface of the base formed in the step (2). By this step, the functional blocks flowing over the surface of the base fall into the holes formed in the base and are self-alignably positioned. The functional blocks which are not positioned in the holes are collected from the dispersion liquid and cleaned. These functional blocks are dispersed in the cleaned liquid and poured over the surface of another base. The functional blocks and the dispersion liquid are continuously reused during a period in which this step is repeatedly performed.

(4) The functional blocks positioned in the holes in the base are provided with electrical interconnection by a conventional metallization process or the like, thereby functioning as part of the completed electric circuit. The functional blocks are mounted on the semiconductor device by these steps.

According to this FSA process, a large number of functional blocks can be mounted on the base at the same time, whereby cost for devices such as displays can be reduced and the manufacturing speed can be increased. Moreover, since only operatable good products can be provided as the functional blocks by performing advance inspection, reliability of the device can be increased. Since various types of materials such as glass, plastics, and silicon can be used for the base in which the functional blocks are positioned, the degrees of freedom relating to the selection of the material for the base can be increased. The material for the functional blocks may be selected from silicon, germanium-silicon, gallium-arsenic, indium-phosphorus, and the like, depending on the function required for the functional blocks. As described above, the FSA process is expected to exhibit superior actions and effects as a method for mounting electronic devices.

Device Manufacture Method

The ferroelectric memory device 2000 of this embodiment can be manufactured by applying the above conventional FSA process. Specifically, the peripheral circuit chip 100A is positioned at the bottom of the depressed portion 310 formed in the mounting base 300 by using the FSA process. The first connection interconnect layer 60 with a given pattern is formed along the surfaces of the peripheral circuit chip 100A and the mounting base 300. The insulating layer 320 which also functions as a planarization layer is formed. The memory cell array chip 200A is positioned in an upper depressed portion 312 formed by the wall surface of the insulating layer 320 by using the FSA process. The second connection interconnect layer 62 for connecting the first connection interconnect layer 60 and the memory cell array chip 200A is formed.

Modification example

Figure 10:
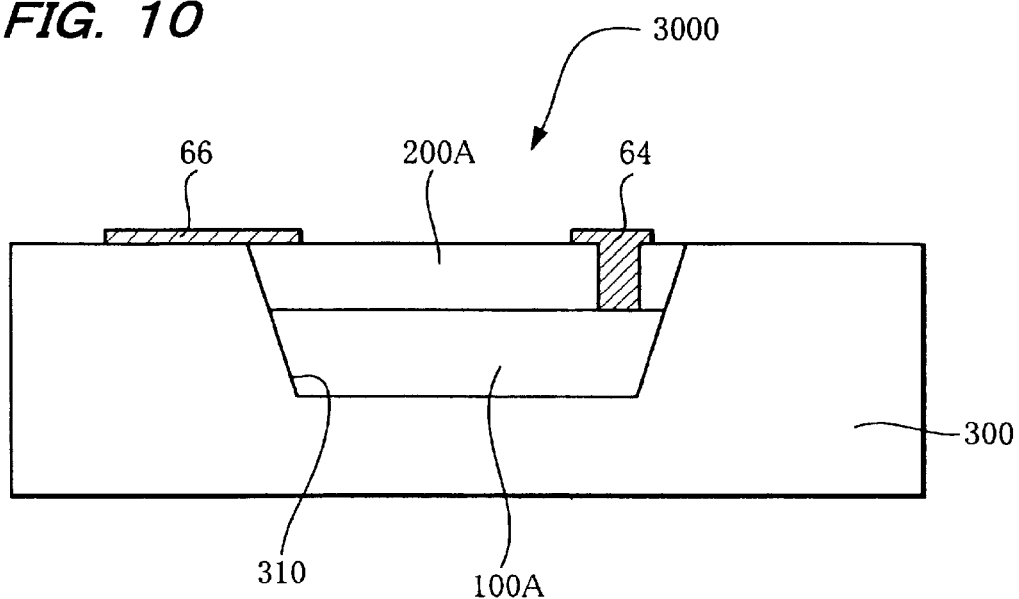
FIG. 10 is a cross-sectional view showing a modification example of the ferroelectric memory device according to the second embodiment of the present invention.

FIG. 10 is a cross-sectional view schematically showing a modification example of the ferroelectric memory device according to the second embodiment. A ferroelectric memory device 3000 of this example differs from the memory device shown in FIG. 5 as to the connection structure between the peripheral circuit chip 100A and the memory cell array chip 200A. Specifically, the ferroelectric memory device 3000 has a structure in which the peripheral circuit chip 100A and the memory cell array chip 200A are layered in the depressed portion 310 formed in the mounting base 300 with no insulating layer interposed therebetween. The peripheral circuit chip 100A and the memory cell array chip 200A are electrically connected through a contact interconnect layer 64 formed in the memory cell array chip 200A. In FIG. 10, a symbol 66 indicates a drain interconnect layer.

According to the ferroelectric memory device of this embodiment, allowing the peripheral circuit section 100A and the memory cell array 200A to be layered ensures that the chip area can be significantly decreased in comparison with the case of disposing the peripheral circuit section and the memory cell array on the same plane, whereby the degree of integration of the memory cells can be increased. Moreover, according to the ferroelectric memory device of this embodiment, since the peripheral circuit section and the memory cell array can be formed in different chips, the fabrication processes for the peripheral circuit section and the memory cell array can be completely separated. As a result, fabrication processes suitable for each chip can be employed, whereby a high performance memory device can be manufactured at high yield. The cost for the memory device can be reduced by selecting a material such as glass or plastics for the mounting base.

Third Embodiment

Modification Example of Memory Cell Array

A modification example of the memory cell array is described below with reference to FIGS. 7 to 9.

(1) First Modification Example

Figure 7:
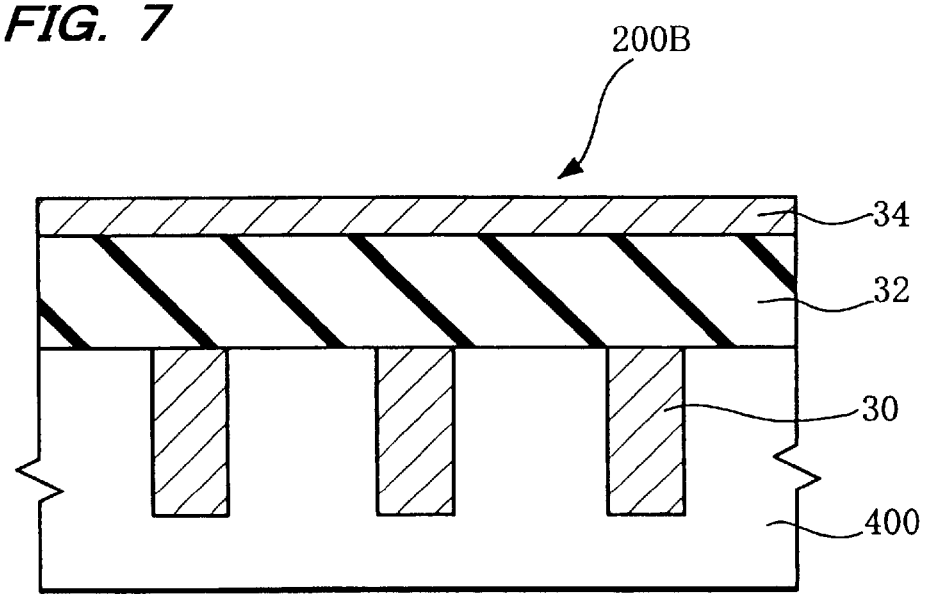
FIG. 7 is a cross-sectional view showing a modification example of a memory cell array.

FIG. 7 is a cross-sectional view showing an essential portion of a memory cell array 200B. The memory cell array 200B includes an insulating substrate 400, the first signal electrodes 30 provided in grooves formed in the insulating substrate 400, the ferroelectric layer 32, and the second signal electrodes 34. The feature of this example is that the first signal electrodes 30 are formed using a damascene process. For example, the first signal electrodes 30 are formed by forming grooves with a given pattern in the insulating substrate 400 formed of a silicon oxide layer, filling the grooves with a metal such as platinum by plating, and polishing and planarizing the metal layer by a CMP process.

Since the ferroelectric layer 32 can be formed in a state in which no steps are present on the insulating substrate 400 by forming the first signal electrodes 30 by the damascene process, the ferroelectric layer 32 can be easily formed. Moreover, since the resistance of the first signal electrodes 30 can be decreased by increasing the height of the first signal electrodes 30, high-speed write or read operations can be achieved.

(2) Second Modification Example

Figure 8:
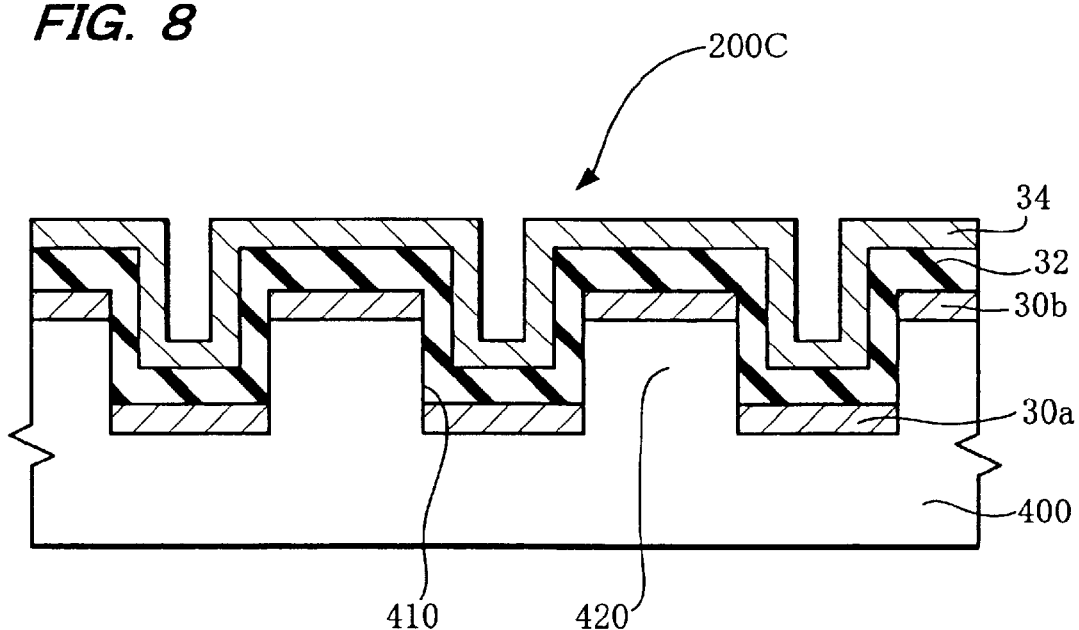
FIG. 8 is a cross-sectional view showing a modification example of a memory cell array.

FIG. 8 is a cross-sectional view showing an essential portion of a memory cell array 200C. In this example, depressed portions 410 and projected portions 420 with a given pattern are formed on the insulating substrate 400. First signal electrodes 30a and 30b are respectively formed on the bottom of the depressed portions 410 and the upper side of the projected portions 420. The ferroelectric layer 32 is formed on the insulating substrate 400 on which the first signal electrodes 30a and 30b are formed. The second signal electrodes 34 with a given pattern are formed on the ferroelectric layer 32. In the memory cell array 200C having this structure, ferroelectric capacitors are alternately formed up and down in the vertical direction. Therefore, there is no need to provide a space between the first signal electrode 30a and the first signal electrode 30b adjacent thereto in a plan view. Because of this, the memory cells can be arranged at an extremely high degree of integration.

(3) Third Modification Example

Figure 9:
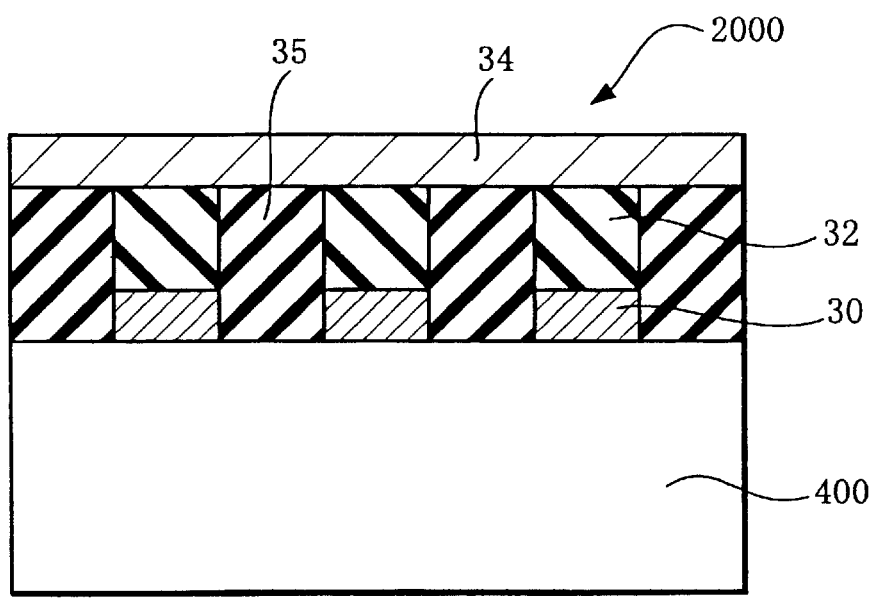
FIG. 9 is a cross-sectional view showing a modification example of a memory cell array.

FIG. 9 is a cross-sectional view showing an essential portion of a memory cell array 200D. In this example, the ferroelectric layers 32 which make up the capacitors are formed in only intersection regions between the first signal electrodes 30 and the second signal electrodes 34. Other dielectric layers 35 formed of a dielectric with a dielectric constant smaller than that of the ferroelectric layers 32, for example, are disposed between the adjacent ferroelectric layers 32. According to the memory cell array 200D having this structure, the floating capacitance of each of the first signal electrodes 30 and the second signal electrodes 34 can be decreased, whereby high-speed write or read operations can be achieved.

The modification examples of the memory cell array are described above. The structures shown in FIGS. 6 to 9 are applicable to both the first embodiment and the second embodiment. Specifically, in the case of applying the memory cell arrays 200A to 200D according to these modification examples to the first embodiment, the insulating substrate 400 corresponds to the uppermost interlayer dielectric (second interlayer dielectric 18 shown in FIG. 2, for example) which makes up the peripheral circuit section 100.

Fourth Embodiment

Figure 11:
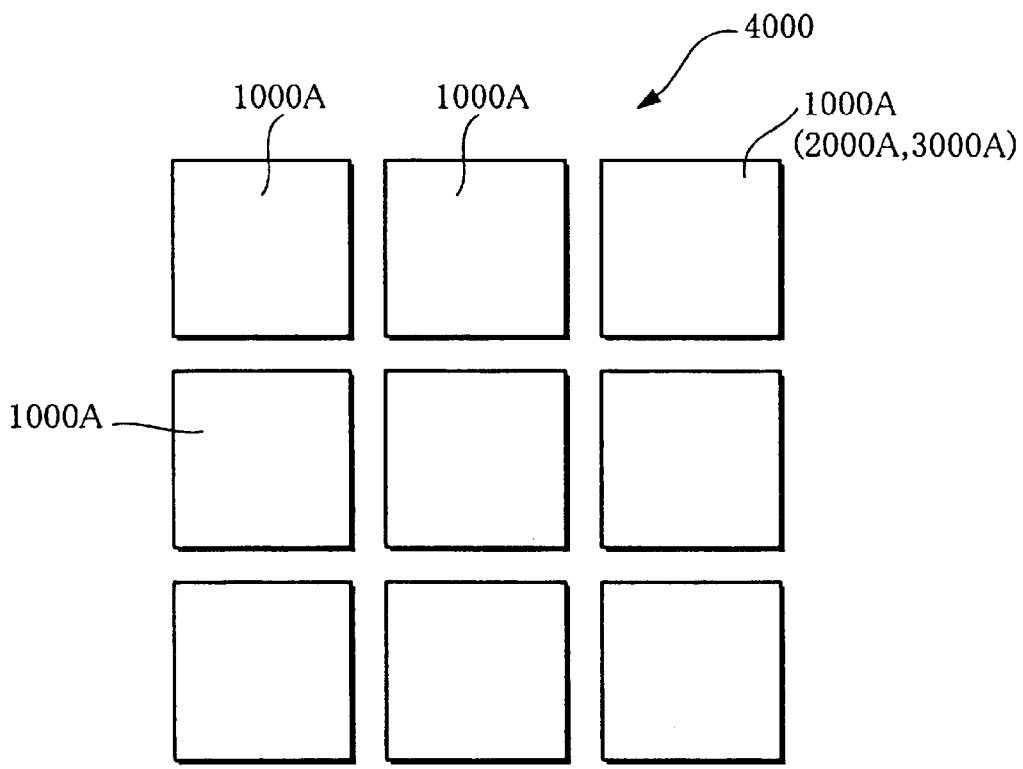
FIG. 11 is a plan view schematically showing a ferroelectric memory device according to a fourth embodiment of the present invention.

FIG. 11 is a plan view schematically showing a ferroelectric memory device according to this embodiment. The feature of this ferroelectric memory device 4000 is that a plurality of unit blocks 1000A including the ferroelectric memory device 1000 according to the first embodiment is arranged, for example. The interconnect length for the signal electrodes can be decreased to a proper level by arranging the ferroelectric memory devices in a divided state, whereby high-speed write or read operations can be achieved. The memory devices 2000 and 3000 according to the second embodiment may be used as unit blocks 2000A and 3000A, respectively, instead of using the unit block 1000A having the same structure as that of the memory device of the first embodiment.

Fifth Embodiment

Figure 12:
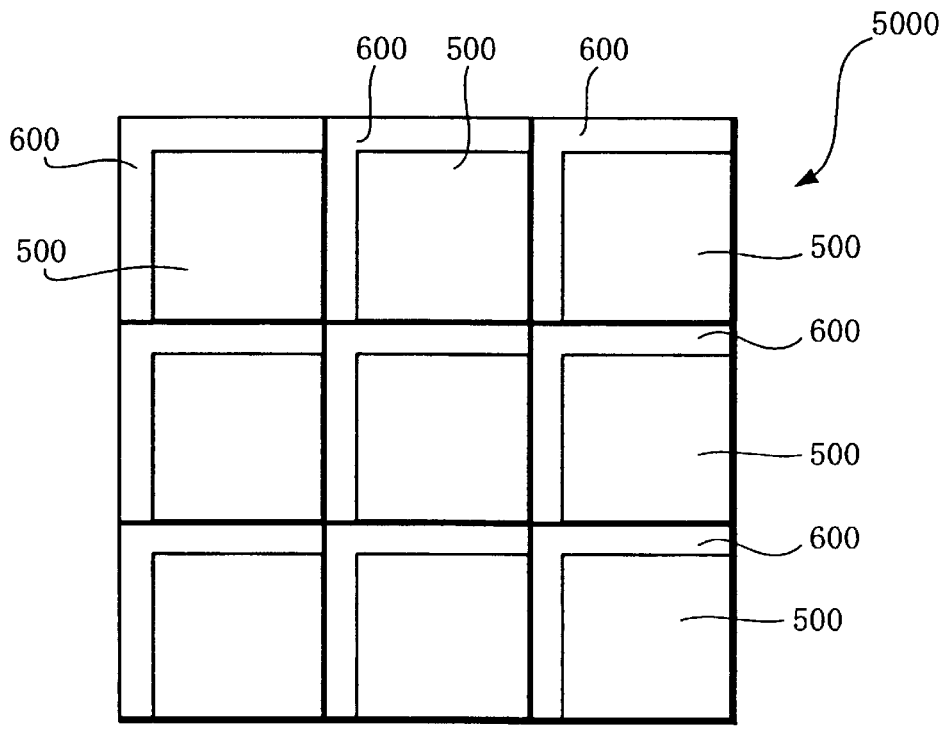
FIG. 12 is a plan view schematically showing a ferroelectric memory device according to a fifth embodiment of the present invention.

FIG. 12 is a plan view schematically showing a ferroelectric memory device according to this embodiment. A ferroelectric memory device 5000 of this example is similar to the fourth embodiment in that the memory cell array is divided into unit blocks. Specifically, in this example, a plurality of unit blocks 500 of the memory cell array is arranged, and peripheral circuit sections 600 are formed between the unit blocks 500 of the memory cell array. In this embodiment, the interconnect length for the signal electrodes can be decreased to a proper level by dividing the memory cell array into a plurality of blocks in the same manner as in the fourth embodiment, whereby high-speed write or read operations can be achieved.

Sixth Embodiment

Figure 13:
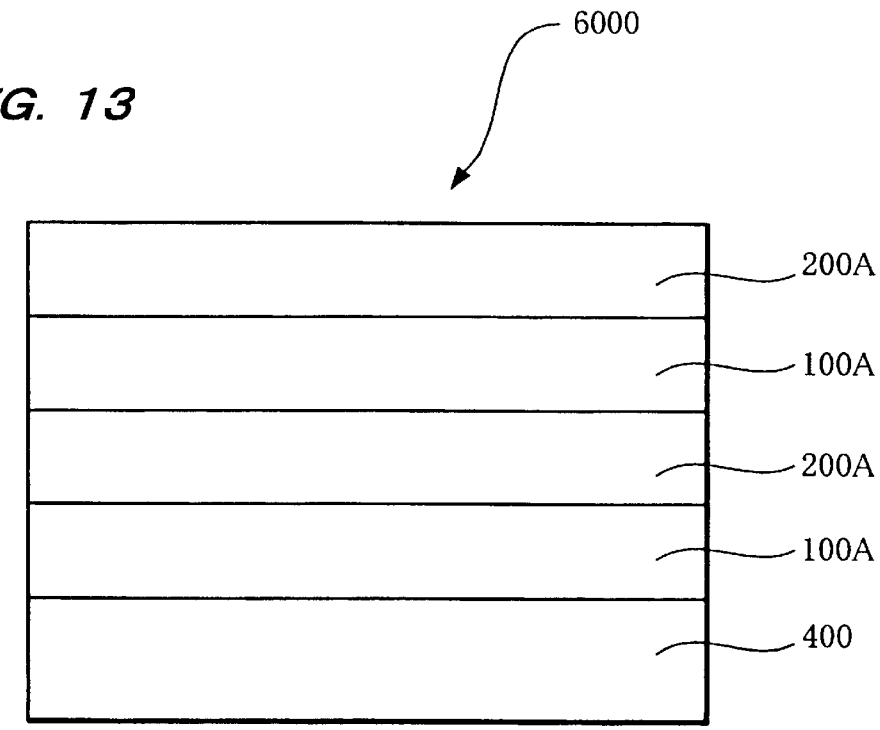
FIG. 13 is a view schematically showing a ferroelectric memory device according to a sixth embodiment of the present invention.

FIG. 13 is a view schematically showing a ferroelectric memory device according to this embodiment. In a ferroelectric memory device 6000 of this example, a plurality of peripheral circuit sections (peripheral circuit chip 100A, for example) and a plurality of memory cell arrays (memory cell array chip 200A, for example) are alternately layered on the insulating substrate 400. A higher degree of integration of the memory cells can be achieved by layering a plurality of pairs of memory devices on the insulating substrate 400.

What is claimed is:

1. A ferroelectric memory device comprising:

a memory cell array, in which memory cells are arranged in a matrix, including first signal electrodes, second signal electrodes arranged in a direction intersecting the first signal electrodes, and a ferroelectric layer disposed at least in intersection regions between the first signal electrodes and the second signal electrodes; and a peripheral circuit section for selectively performing information write or information read with respect to the memory cells, wherein the memory cell array and the peripheral circuit section are disposed in different layers, the memory cell array and the peripheral circuit section are formed in different chips, to form a memory cell array chip and a peripheral circuit chip, respectively, and the memory cell array chip and the peripheral circuit chip are layered on a mounting base in the order from the peripheral circuit chip to the memory cell array chip or in the order from the memory cell array chip to the peripheral circuit chip.

2. The ferroelectric memory device according to claim 1, wherein the memory cell array and the peripheral circuit section are layered on a single semiconductor substrate in order from the peripheral circuit section to the memory cell array.

3. The ferroelectric memory device according to claim 1, wherein the mounting base has a depressed portion for a chip to be positioned, and the peripheral circuit chip and the memory cell array chip are mounted in the depressed portion in a layered manner.

4. The ferroelectric memory device according to claim 3, wherein a semiconductor, glass, or plastic is used as a material for the mounting base.

5. The ferroelectric memory device according to claim 1, wherein the memory cell array comprises an underlying layer formed of a ferroelectric material or a material having a crystal structure similar to a structure of a ferroelectric, the first signal electrodes, the ferroelectric layer, and the second signal electrodes which are layered on a substrate.

6. A ferroelectric memory device comprising, a memory cell array, in which memory cells are arranged in a matrix, including first signal electrodes, second signal electrodes arranged in a direction intersecting the first signal electrodes, and a ferroelectric layer disposed at least in intersection regions between the first signal electrodes and the second signal electrodes; and a peripheral circuit section for selectively performing information write or information read with respect to the memory cells, wherein the memory cell array and the peripheral circuit section are disposed in different layers, the memory cell array comprises an insulating substrate, the first signal electrodes provided in grooves formed in the insulating substrate, the ferroelectric layer and the second signal electrodes are layered on the insulating substrate on which the first signal electrodes are formed.

7. A ferroelectric memory device comprising, a memory cell array, in which memory cells are arranged in a matrix, including first signal electrodes, second signal electrodes arranged in a direction intersecting the first signal electrodes, and a ferroelectric layer disposed at least in intersection regions between the first signal electrodes and the second signal electrodes; and a peripheral circuit section for selectively performing information write or information read with respect to the memory cells, wherein the memory cell array and the peripheral circuit section are disposed in different layers, the memory cell array comprises an insulating substrate on which is formed depressed portions and projected portions in a given pattern, the first signal electrodes are formed at a bottom of the depressed portions and an upper side of the projected portions, and the ferroelectric layer and the second signal electrodes are layered on the insulating substrate on which the first signal electrodes are formed.

8. The ferroelectric memory device according to claim 1, wherein the memory cell array comprises an insulating substrate on which is formed the first signal electrodes, the ferroelectric layers, and the second signal electrodes, the ferroelectric layer is formed in a divided manner and disposed in the intersection regions between the first signal electrodes and the second signal electrodes, and dielectric layers differing from the ferroelectric layers are formed between the adjacent divided ferroelectric layers.

9. The ferroelectric memory device according to claim 8, wherein the dielectric layers are formed of a material with a dielectric constant smaller than a dielectric constant of the ferroelectric layer.

10. A ferroelectric memory device comprising a plurality of unit blocks of ferroelectric memory devices according to claim 1 arranged in a given pattern.

11. A ferroelectric memory device comprising:

a plurality of depressed portions having a given shape disposed in a mounting base in a given pattern, and a memory cell array and a peripheral circuit section which are formed in different chips to form a memory cell array chip and a peripheral circuit chip, respectively, wherein the memory cell array chip and the peripheral circuit chip have a given shape corresponding to a shape of each of the depressed portions in a layered manner, and the peripheral circuit chip and the memory cell array chip are layered in each of the depressed portions.

12. The ferroelectric memory device according to claim 11, wherein the memory cell array chip is layered on the peripheral circuit chip, or the peripheral circuit chip is layered on the memory cell array chip.

13. The ferroelectric memory device according to claim 1, wherein at least a part of the peripheral circuit section is provided below the memory cell array.

* * * * *